(12) United States Patent
Childress et al.

(10) Patent No.: US 9,412,399 B2
(45) Date of Patent: Aug. 9, 2016

(54) UNDERLAYER FOR REFERENCE LAYER OF POLYCRYSTALLINE CPP GMR SENSOR STACK

(71) Applicant: HGST Netherlands B.V., Amsterdam (NL)

(72) Inventors: Jeffrey Robinson Childress, San Jose, CA (US); Young-Suk Choi, Los Gatos, CA (US); Tomoya Nakatani, San Jose, CA (US); John Creighton Read, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/488,735

(22) Filed: Sep. 17, 2014

(65) Prior Publication Data
US 2016/0078888 A1    Mar. 17, 2016

(51) Int. Cl.
*G11B 5/39*    (2006.01)

(52) U.S. Cl.
CPC .................... *G11B 5/3903* (2013.01)

(58) Field of Classification Search
None
See application file for complete search history.

(56) References Cited

U.S. PATENT DOCUMENTS

| | | | | |
|---|---|---|---|---|
| 6,181,537 | B1 * | 1/2001 | Gill | B82Y 10/00 360/324.2 |
| 7,221,545 | B2 | 5/2007 | Gill | |
| 7,672,089 | B2 | 3/2010 | Lin | |
| 7,791,845 | B2 * | 9/2010 | Mauri | B82Y 10/00 257/421 |
| 8,081,405 | B2 | 12/2011 | Lin | |
| 8,094,421 | B2 | 1/2012 | Lin | |
| 8,611,053 | B2 | 12/2013 | Brinkman et al. | |
| 8,617,644 | B2 | 12/2013 | Carey et al. | |
| 2006/0017081 | A1 * | 1/2006 | Sun | B82Y 25/00 257/295 |
| 2006/0141640 | A1 * | 6/2006 | Huai | B82Y 25/00 438/3 |
| 2009/0161268 | A1 | 6/2009 | Lin | |

OTHER PUBLICATIONS

Nikolaev, et al.; "All-Heusler Alloy" Current-Perpendicular-To-Plane Giant Magnetoresistance; Applied Physics Letters 94, 222501; dated Apr. 7, 2009; 3 pages.

* cited by examiner

*Primary Examiner* — Will J Klimowicz
(74) *Attorney, Agent, or Firm* — Patterson & Sheridan, LLP

(57) ABSTRACT

Embodiments disclosed herein generally relate to a magnetic head having an amorphous ferromagnetic reference layer. The ferromagnetic reference layer may have amorphous structure as a result of an amorphous ferromagnetic underlayer that the ferromagnetic reference layer is deposited thereon. The amorphous ferromagnetic reference layer enhances magnetoresistance, leading to an improved magnetic head.

11 Claims, 5 Drawing Sheets

UNDERLAYER FOR REFERENCE LAYER OF POLYCRYSTALLINE CPP GMR SENSOR STACK

BACKGROUND

1. Field

Embodiments disclosed herein generally relate to a magnetic read head for use in a hard disk drive.

2. Description of the Related Art

The heart of a computer is a magnetic disk drive which typically includes a rotating magnetic disk, a slider that has read and write heads, a suspension arm above the rotating disk and an actuator arm that swings the suspension arm to place the read and/or write heads over selected tracks on the rotating disk. The suspension arm biases the slider towards the surface of the disk when the disk is not rotating but, when the disk rotates, air is swirled by the rotating disk adjacent a media facing surface (MFS) of the slider causing the slider to ride on an air bearing a slight distance from the surface of the rotating disk. When the slider rides on the air bearing, the write and read heads are employed for writing magnetic impressions to and reading magnetic signal fields from the rotating disk. The read and write heads are connected to processing circuitry that operates according to a computer program to implement the writing and reading functions.

One type of conventional magnetoresistive (MR) sensor used as the read head is a "spin-valve" sensor based on the giant magnetoresistance (GMR) effect. A GMR-spin-valve sensor has a stack of layers that includes two ferromagnetic layers separated by a nonmagnetic electrically conductive spacer layer. One ferromagnetic layer, typically called the "reference" layer, has its magnetization direction fixed, such as by being pinned by exchange coupling with an adjacent antiferromagnetic "pinning" layer, and the other ferromagnetic layer, typically called the "free" layer, has its magnetization direction free to rotate in the presence of an external magnetic field. With a sense current applied to the sensor, the rotation of the free layer magnetization relative to the fixed layer magnetization is detectable as a change in electrical resistance. If the sense current is directed perpendicularly through the planes of the layers in the sensor stack, the sensor is referred to as current-perpendicular-to-the-plane (CPP) sensor. Metallic CPP GMR sensor having low magnetoresistance is beneficial to increase signal to noise ratio, but the signal output of metallic CPP GMR sensor using transition magnetic metals is too low. In order to increase the signal output, Heusler alloy with high spin polarization is used in the reference layer.

However, Heusler alloy is deposited using high temperature and/or thick crystalline template, which may cause sensor performance to degrade. Therefore, an improved read head is needed.

SUMMARY

Embodiments disclosed herein generally relate to a magnetic head having an amorphous ferromagnetic reference layer. The ferromagnetic reference layer may have amorphous structure as a result of an amorphous ferromagnetic underlayer that the ferromagnetic reference layer is deposited thereon. The amorphous ferromagnetic reference layer enhances magnetoresistance, leading to an improved magnetic head.

In one embodiment, a magnetic head is disclosed. The magnetic head includes a sensor stack, and the sensor stack includes an antiferromagnetic layer, a first crystalline ferromagnetic underlayer, an amorphous ferromagnetic reference layer disposed over the first crystalline ferromagnetic underlayer, a nonmagnetic layer disposed on the amorphous ferromagnetic reference layer, a second crystalline ferromagnetic underlayer disposed on the nonmagnetic layer, and a ferromagnetic free layer disposed over the second crystalline ferromagnetic underlayer.

In another embodiment, a magnetic head is disclosed. The magnetic head includes a sensor stack, and the sensor stack includes an antiferromagnetic layer, a ferromagnetic pinned layer disposed on the antiferromagnetic layer, a first nonmagnetic layer disposed on the ferromagnetic pinned layer, a first crystalline ferromagnetic underlayer disposed on the first nonmagnetic layer, an amorphous ferromagnetic reference layer disposed over the first crystalline ferromagnetic underlayer, a second nonmagnetic layer disposed on the amorphous ferromagnetic reference layer, a second crystalline ferromagnetic underlayer disposed on the second nonmagnetic layer, and a ferromagnetic free layer disposed over the second crystalline ferromagnetic underlayer.

In another embodiment, a hard disk drive is disclosed. The hard disk drive includes a magnetic media, a magnetic write head, and a magnetic read head. The magnetic read head includes a sensor stack, and the sensor stack includes an antiferromagnetic layer, a first crystalline ferromagnetic underlayer disposed over the antiferromagnetic layer, a first amorphous ferromagnetic underlayer disposed over the first crystalline ferromagnetic underlayer, an amorphous ferromagnetic reference layer disposed over the antiferromagnetic layer, a first nonmagnetic layer disposed over the amorphous ferromagnetic reference layer, a second crystalline ferromagnetic underlayer disposed over the first nonmagnetic layer, a second amorphous ferromagnetic underlayer disposed over the second crystalline ferromagnetic underlayer, and an amorphous ferromagnetic free layer disposed over the second amorphous ferromagnetic underlayer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments in any field involving magnetic sensors.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments. However, it should be understood that the disclosure is not limited to specific described embodiments. Instead, any combination of the following features and elements, whether related to different embodiments or not, is contemplated to implement and practice the claimed subject matter. Furthermore, although embodiments may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s).

Embodiments disclosed herein generally relate to a magnetic head having an amorphous ferromagnetic reference layer. The ferromagnetic reference layer may have amorphous structure as a result of an amorphous ferromagnetic underlayer that the ferromagnetic reference layer is deposited thereon. The amorphous ferromagnetic reference layer enhances magnetoresistance, leading to an improved magnetic head.

Figure 1:
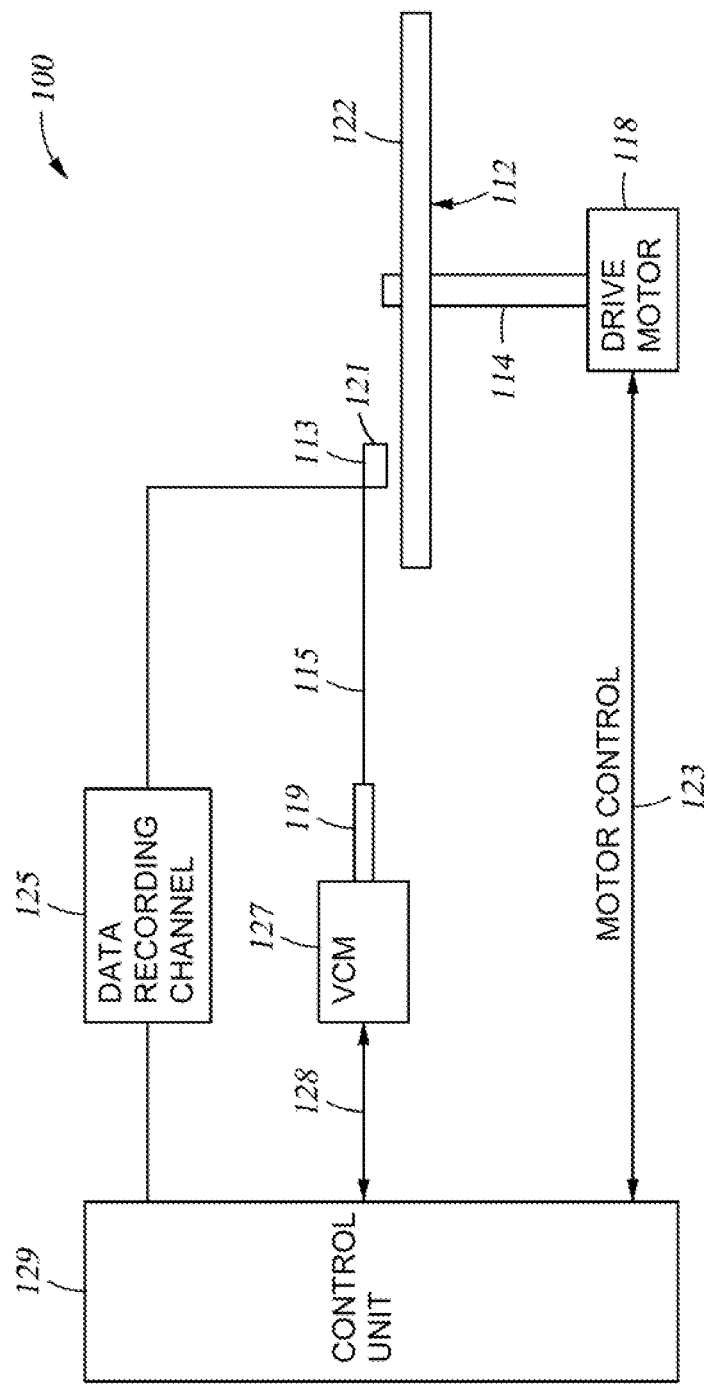
FIG. 1 illustrates a disk drive system, according to embodiments described herein.

FIG. 1 illustrates a disk drive 100 according to one embodiment disclosed herein. As shown, at least one rotatable magnetic media 112 is supported on a spindle 114 and rotated by a disk drive motor 118. The magnetic recording on each disk is in the form of any suitable patterns of data tracks, such as annular patterns of concentric data tracks (not shown) on the magnetic media 112.

At least one slider 113 is positioned near the magnetic media 112, each slider 113 supporting one or more magnetic head assemblies 121. As the magnetic disk rotates, the slider 113 moves radially in and out over the disk surface 122 so that the magnetic head assembly 121 may access different tracks of the magnetic media 112 where desired data are written. Each slider 113 is attached to an actuator arm 119 by way of a suspension 115. The suspension 115 provides a slight spring force which biases the slider 113 towards the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by control unit 129.

During operation of the disk drive 100, the rotation of the magnetic media 112 generates an air bearing between the slider 113 and the disk surface 122 which exerts an upward force or lift on the slider 113. The air bearing thus counterbalances the slight spring force of suspension 115 and supports slider 113 off and slightly above the media 112 surface by a small, substantially constant spacing during normal operation.

The various components of the disk drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on media 112. Write and read signals are communicated to and from write and read heads on the assembly 121 by way of recording channel 125.

The above description of a typical magnetic disk storage system and the accompanying illustration of FIG. 1 are for representation purposes only. It should be apparent that disk storage systems may contain a large number of disks and actuators, and each actuator may support a number of sliders.

Figure 2A:
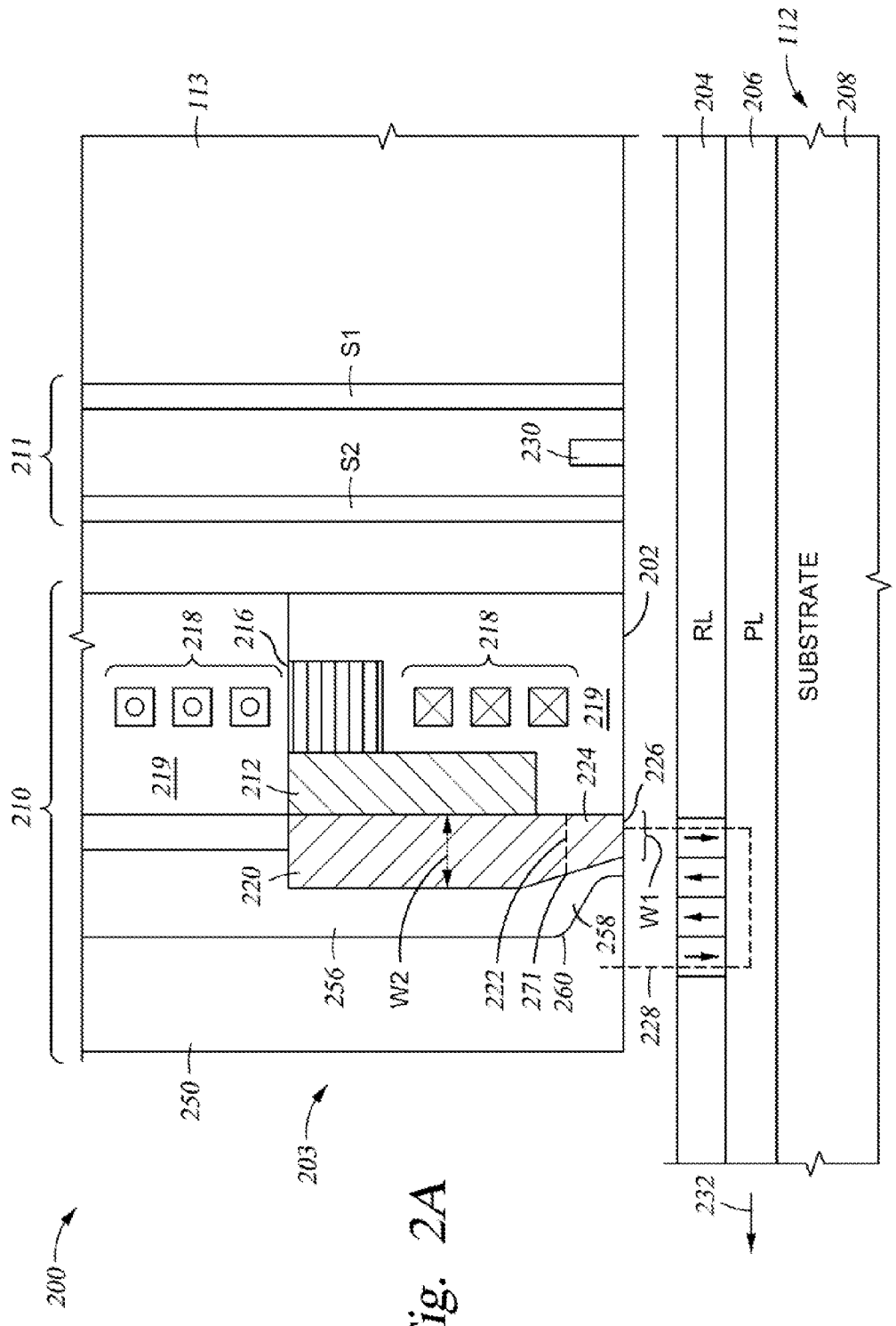
FIG. 2A is a cross sectional side view of a read/write head and magnetic disk of the disk drive of FIG. 1, according to embodiments described herein.

FIG. 2A is a fragmented, cross sectional side view through the center of a read/write head 200 mounted on the slider 113 and facing magnetic media 112. In some embodiments, the magnetic media 112 may be a "dual-layer" medium that includes a perpendicular magnetic data recording layer (RL) 204 on a "soft" or relatively low-coercivity magnetically permeable underlayer (PL) 206 formed on a disk substrate 208. The read/write head 200 includes a MFS 202, a magnetic write head 210 and a magnetic read head 211, and is mounted such that the MFS 202 is facing the magnetic media 112. In FIG. 2A, the media 112 moves past the write head 210 in the direction indicated by the arrow 232, so the portion of the read/write head 200 that is opposite the slider 113 is often called the "trailing" end 203.

In some embodiments, the magnetic read head 211 is a MR read head that includes a MR sensing element 230 located between MR shields S1 and S2. The RL 204 is illustrated with perpendicularly recorded or magnetized regions, with adjacent regions having magnetization directions, as represented by the arrows located in the RL 204. The magnetic fields of the adjacent magnetized regions are detectable by the MR sensing element 230 as the recorded bits.

The write head 210 includes a magnetic circuit made up of a main pole 212 and a yoke 216. The write head 210 also includes a thin film coil 218 shown in the section embedded in non-magnetic material 219 and wrapped around yoke 216. In an alternative embodiment, the yoke 216 may be omitted, and the coil 218 may wrap around the main pole 212. A write pole 220 is magnetically connected to the main pole 212 and has an end 226 that defines part of the MFS 202 of the magnetic write head 210 facing the outer surface of media 112.

Write pole 220 may be a flared write pole and may include a flare point 222 and a pole tip 224 that includes the end 226. The flare may extend the entire height of write pole 220 (i.e., from the end 226 of the write pole 220 to the top of the write pole 220), or may only extend from the flare point 222, as shown in FIG. 2A. In one embodiment the distance between the flare point 222 and the ABS is between about 30 nm and about 150 nm.

The write pole 220 includes a tapered surface 271 which increases the width of the write pole 220 from a first width W1 at the MFS 202 to a second width W2 away from the MFS 202. In one embodiment, the width W1 may be between around 60 nm and 200 nm, and the width W2 may be between around 120 nm and 350 nm. While the tapered region 271 is shown with a single straight surface in FIG. 2A, in alternative embodiment, the tapered region 271 may include a plurality of tapered surfaces with different taper angles with respect to the MFS 202.

The tapering improves magnetic performance. For example, reducing the width W1 at the MFS 202 may concentrate a magnetic field generated by the write pole 220 over portions of the magnetic media 112. In other words, reducing the width W1 of the write pole 220 at the MFS 202 reduces the probability that tracks adjacent to a specified track are erroneously altered during writing operations.

In operation, write current passes through the coil 218 and induces a magnetic field (shown by dashed line 228) from the write pole 220 that passes through the RL 204 (to magnetize the region of the RL 204 beneath the write pole 220), through the flux return path provided by the PL 206, and back to an upper return pole 250. In one embodiment, the greater the magnetic flux of the write pole 220, the greater the probability of accurately writing to specified regions of the RL 204.

FIG. 2A further illustrates one embodiment of the upper return pole 250 may be a magnetic shield that is separated from write pole 220 by a nonmagnetic gap layer 256. In some embodiments, the upper return pole 250 may be a trailing shield wherein substantially all of the shield material is on the trailing end 203. Alternatively, in some embodiments, the upper return pole 250 may be a wrap-around shield wherein the shield covers the trailing end 203 and also wraps around the sides of the write pole 220. As FIG. 2A is a cross section through the center of the read/write head 200, it represents both trailing and wrap-around embodiments.

Near the MFS 202, the nonmagnetic gap layer 256 has a reduced thickness and forms a shield throat gap 258. The throat gap width is generally defined as the distance between the write pole 220 and the upper return pole 250 at the MFS 202. The upper return pole 250 is formed of magnetically permeable material (such as Ni, Co and Fe alloys) and the gap layer 256 is formed of nonmagnetic material (such as Ta, TaO, Ru, Rh, NiCr, SiC or $Al_2O_3$). A taper 260 in the gap material provides a gradual transition from the throat gap width at the MFS 202 to a maximum gap width above the taper 260. This gradual transition in width forms a tapered bump in the nonmagnetic gap layer 256 that allows for greater magnetic flux density from the write pole 220, while avoiding saturation of the upper return pole 250.

Figure 2B:
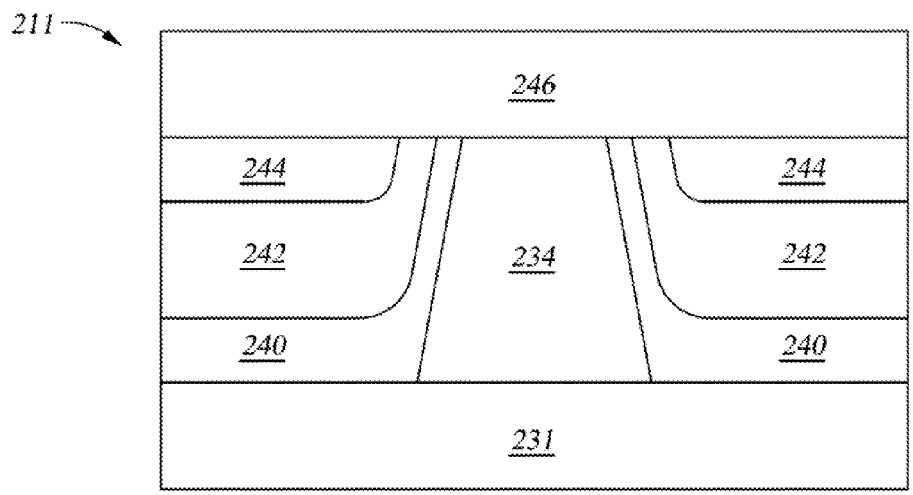
FIG. 2B is a schematic cross sectional view of a portion of the read magnetic head according to one embodiment.

FIG. 2B is a schematic cross sectional view of a portion of the magnetic head 211 according to one embodiment. The thickness and the width of each layer, are for example only, and each layer may be thicker/thinner and/or wider/narrower. The magnetic head 211 includes a first shield layer 231 and a second shield layer 246. The first and second shield layers 231, 246 may be the MR shields S1, S2 described in FIG. 2A. The first and second shield layers 231, 246 may each comprise a ferromagnetic material. Suitable ferromagnetic materials that may be utilized include Ni, Fe, Co, NiFe, NiFeCo, NiCo, CoFe and combinations thereof The magnetic head 211 also includes a sensor stack 234 (discussed in detail below). The sensor stack 234 may be the sensing element 230 described in FIG. 2A. Following the formation of the sensor stack 234, an insulating layer 240 may be deposited on the first shield layer 231 as well as the sidewalls of the sensor stack 234. The insulating layer 240 may comprise an insulating material such as aluminum oxide. The insulating layer 240 may be deposited by well known deposition methods such as atomic layer deposition (ALD), chemical vapor deposition (CVD), sputtering, etc. After the insulating layer 240 is deposited, a hard bias layer 242 is then deposited. The hard bias layer 242 may comprise a material having a high magnetic moment such as CoFe.

Once the hard bias layer 242 is deposited, a hard bias capping structure 244 may be formed. In one embodiment, the hard bias capping structure 244 may comprise a multiple layer structure comprising a first tantalum layer, an iridium layer, and a second tantalum layer. The sensor stack 234, the insulating layer 240, the hard bias layer 242 and the hard bias capping structure 244 may be disposed between the first and second shield layers 231, 246.

Figure 3:
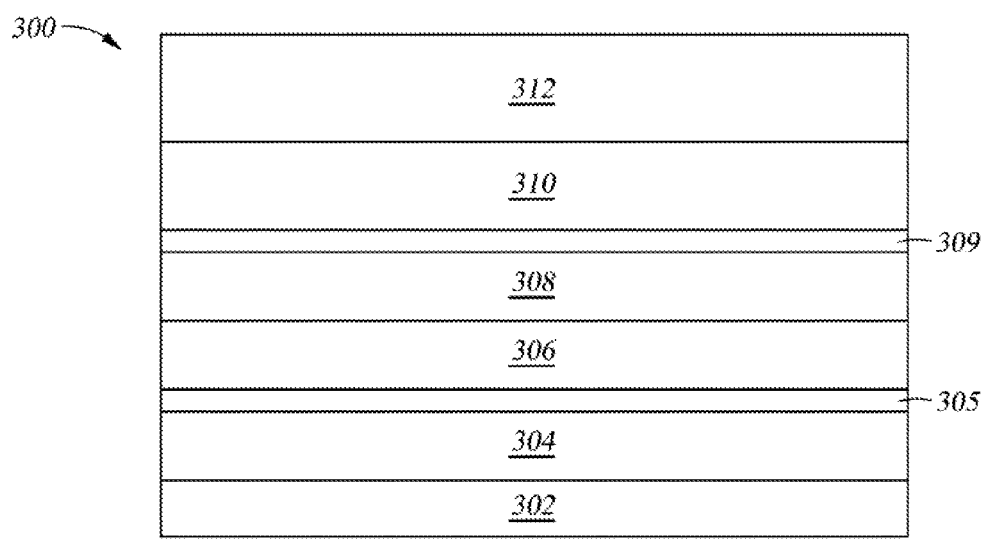
FIG. 3 is a schematic cross sectional view of a sensor stack according to one embodiment.

FIG. 3 is a schematic cross sectional view of a sensor stack 300 according to one embodiment. The sensor stack 300 may be the sensor stack 234 described in FIG. 2B. The sensor stack 300 may include one or more seed layers 302 to promote the optimal grain size and texture of an antiferromagnetic layer 304, which may be deposited on the one or more seed layers 302. The one or more seed layers 302 may comprise Ta, Ru, NiFe, NiFeCr, CoFe, CoFeB, CoHf, Cu or combinations thereof. The antiferromagnetic layer 304 may comprise Pt, Ir, Rh, Ni, Fe, Mn, or combinations thereof such as PtMn, PtPdMn, NiMn or IrMn. A ferromagnetic reference layer 306 may be deposited over the antiferromagnetic layer 304. The word over, as used in this application, means that a first layer is disposed above a second layer, and may or may not be in direct contact with the second layer. There may or may not be additional layers disposed between the first and second layers. The word on, as used in this application, means that a first layer is disposed on and directly contacting a second layer, and there may not be any additional layers disposed between the first and second layers. The word over has a broader scope when describing the layers comparing to the word on. The ferromagnetic reference layer 306 may be amorphous, which enhances magnetoresistance. A crystalline ferromagnetic underlayer 305 may be disposed between the amorphous ferromagnetic reference layer 306 and the antiferromagnetic layer 304 in order to enhance the pinning strength. The crystalline ferromagnetic underlayer 305 may include Co, Fe, Ni, or any combinations thereof.

Conventionally, the reference layer is made of a Heusler alloy, which has crystalline structure, and is formed under high temperature such as greater than 150 degrees Celsius and/or using a thick crystalline template. The high temperature process can damage various magnetic coupling and thick crystalline template increases the read gap. In order to form the amorphous ferromagnetic reference layer 306, the deposition temperature of the reference layer 306 may be very low, such as between about 50 K to about 100 K. In one embodiment, the substrate on which the crystalline ferromagnetic underlayer 305 is deposited is placed on a cryogenic stage when the reference layer 306 is deposited on the crystalline ferromagnetic underlayer 305 by physical vapor deposition (PVD). Another method for forming the amorphous ferromagnetic reference layer 306 is to flow an oxygen containing gas into the deposition chamber before depositing the reference layer 306. As a result, an oxygen surfactant layer may be formed on the crystalline ferromagnetic underlayer 305, which causes the ferromagnetic reference layer 306 that is deposited thereon to have an amorphous structure. Another method for forming the amorphous ferromagnetic reference layer 306 is to dope the Heusler alloy that would be used for the reference layer 306 with one or more glass forming dopants, such as boron. The glass forming dopants do not have solid solubility with the Heusler alloy and after post anneal the dopants diffuse out from the Heusler alloy, leading to an amorphous ferromagnetic reference layer 306. The amorphous ferromagnetic reference layer 306 may comprise any Heusler alloy.

A nonmagnetic spacer layer 308 may be deposited on the amorphous ferromagnetic reference layer 306. The spacer layer 308 may comprise Cu, Ag, or AgSn. A crystalline ferromagnetic underlayer 309 may be deposited on the spacer layer 308. The crystalline ferromagnetic underlayer 309 may comprise the same materials as the crystalline ferromagnetic underlayer 305. A ferromagnetic free layer 310 may be deposited over the nonmagnetic spacer layer 308, such as on the crystalline ferromagnetic underlayer 309. The ferromagnetic free layer 310 may be amorphous or crystalline. Having an amorphous ferromagnetic free layer 310 may further enhance magnetoresistance. Similar methods may be performed to form the amorphous ferromagnetic free layer 310 on the crystalline ferromagnetic underlayer 309, such as having a low deposition temperature, forming an oxygen surfactant layer and doping with one or more glass forming dopants. The amorphous ferromagnetic free layer 310 may comprise any Heusler alloy. In one embodiment, the ferromagnetic free layer 310 is crystalline, and is deposited directly on the nonmagnetic spacer layer 308. The crystalline ferromagnetic underlayer 309 may not be present in the stack if the ferromagnetic free layer 310 is crystalline. A capping layer 312 may be deposited on the ferromagnetic free layer 310. The capping layer 312 may comprise Hf, Ru, Ta or combination thereof.

Figure 4:
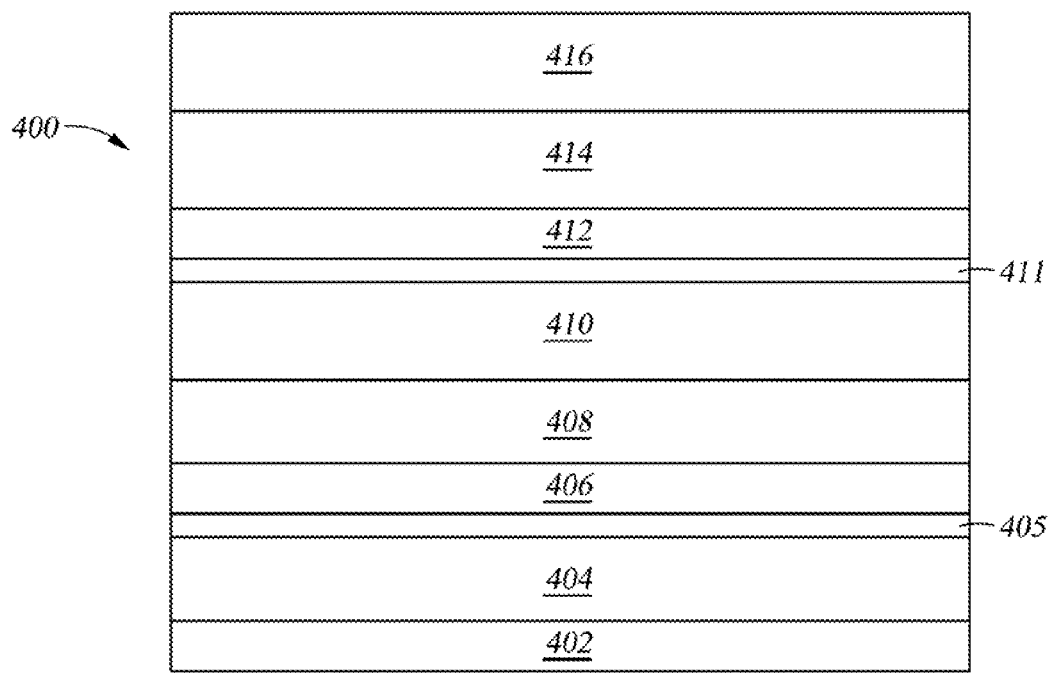
FIG. 4 is a schematic cross sectional view of a sensor stack according to one embodiment.

FIG. 4 is a schematic cross sectional view of a sensor stack 400 according to one embodiment. The sensor stack 400 may be the sensor stack 234 described in FIG. 2B. The sensor stack 400 may include one or more seed layers 402, which may comprise the same materials as the one or more seed layers 302 described in FIG. 3. An antiferromagnetic layer 404 may be deposited on the one or more seed layers 402, and the antiferromagnetic layer 404 may comprise the same materials as the antiferromagnetic layer 304 described in FIG. 3. A crystalline ferromagnetic underlayer 405 may be deposited on the antiferromagnetic layer 404. The crystalline ferromagnetic underlayer 405 may comprise the same materials as the crystalline ferromagnetic underlayer 305 described in FIG. 3. An amorphous ferromagnetic underlayer 406 may be deposited on the crystalline ferromagnetic underlayer 405. The amorphous ferromagnetic underlayer 406 may comprise an alloy of one or more of Co, Fe, Ni, Ta, Ti, Zr, Nb, Si, W, Ge and B. In one embodiment, the amorphous ferromagnetic underlayer 406 is a CoFeBTa layer, a CoTiB layer or a CoFeGe layer. A ferromagnetic reference layer 408 may be deposited on the amorphous ferromagnetic underlayer 406, and the ferromagnetic reference layer 408 may be amorphous due to the amorphous structure of the underlayer 406. The reference layer 408 may comprise one or more magnetic materials such as, for example NiFe, CoFe, CoFeB, or diluted magnetic alloys. In one embodiment, the reference layer 408 is made of the same material as the amorphous ferromagnetic underlayer 406.

A nonmagnetic spacer layer 410 may be deposited on the amorphous ferromagnetic reference layer 408 and the nonmagnetic spacer layer 410 may comprise the same materials as the nonmagnetic spacer layer 308 described in FIG. 3. A crystalline ferromagnetic underlayer 411 may be deposited on the spacer layer 410, and the crystalline ferromagnetic underlayer 411 may comprise the same materials as the crystalline ferromagnetic underlayer 305 described in FIG. 3. Another amorphous ferromagnetic underlayer 412 may be deposited over the nonmagnetic spacer layer 410, such as on the crystalline ferromagnetic underlayer 411. The amorphous ferromagnetic underlayer 412 may comprise the same materials as the amorphous ferromagnetic underlayer 406. A ferromagnetic free layer 414 may be deposited on the amorphous ferromagnetic underlayer 412, and the ferromagnetic free layer 414 may be amorphous due to the amorphous structure of the underlayer 412. The amorphous ferromagnetic free layer 414 may comprise Co, Fe, B, Co, CoFe, CoFeB, NiFe, CoHf or combinations thereof. Alternatively, the amorphous ferromagnetic free layer 414 may be made of the same material as the amorphous ferromagnetic underlayer 412. In one embodiment, the ferromagnetic free layer 414 is crystalline, and is deposited directly on the nonmagnetic spacer layer 410. The crystalline ferromagnetic underlayer 411 and the amorphous ferromagnetic underlayer 412 may not be present in the stack if the ferromagnetic free layer 414 is crystalline. Again the amorphous ferromagnetic reference and free layers 408, 414 enhance magnetoresistance. A capping layer 416 may be deposited on the amorphous ferromagnetic free layer 414, and the capping layer 416 may comprise the same materials as the capping layer 312 described in FIG. 3.

Figure 5:
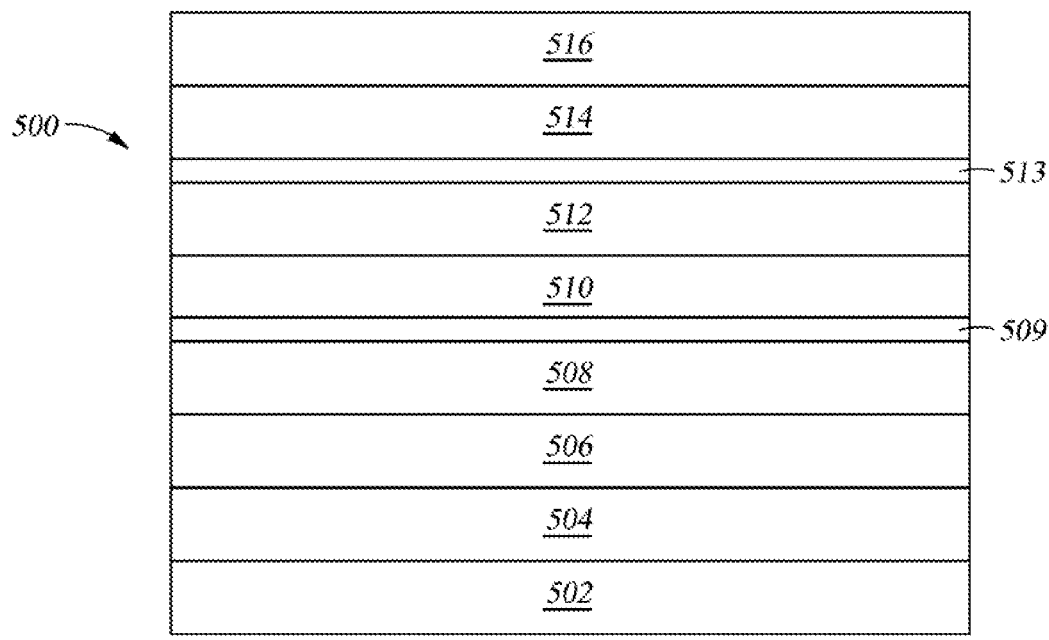
FIG. 5 is a schematic cross sectional view of a sensor stack according to one embodiment.
Figure 6:
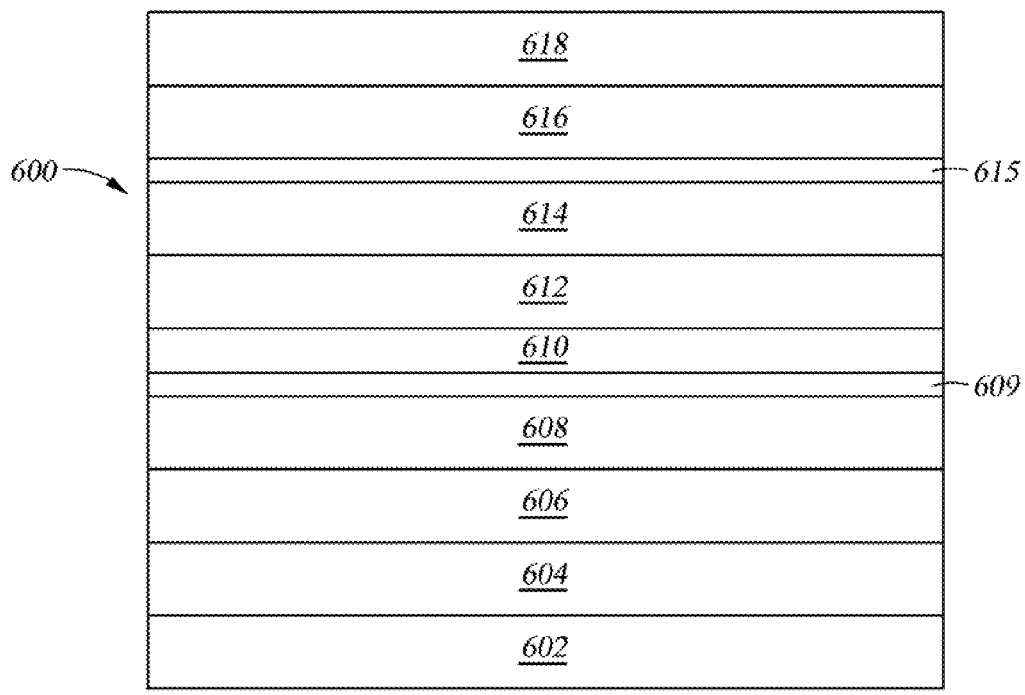
FIG. 6 is a schematic cross sectional view of a sensor stack according to one embodiment.
Figure 7:
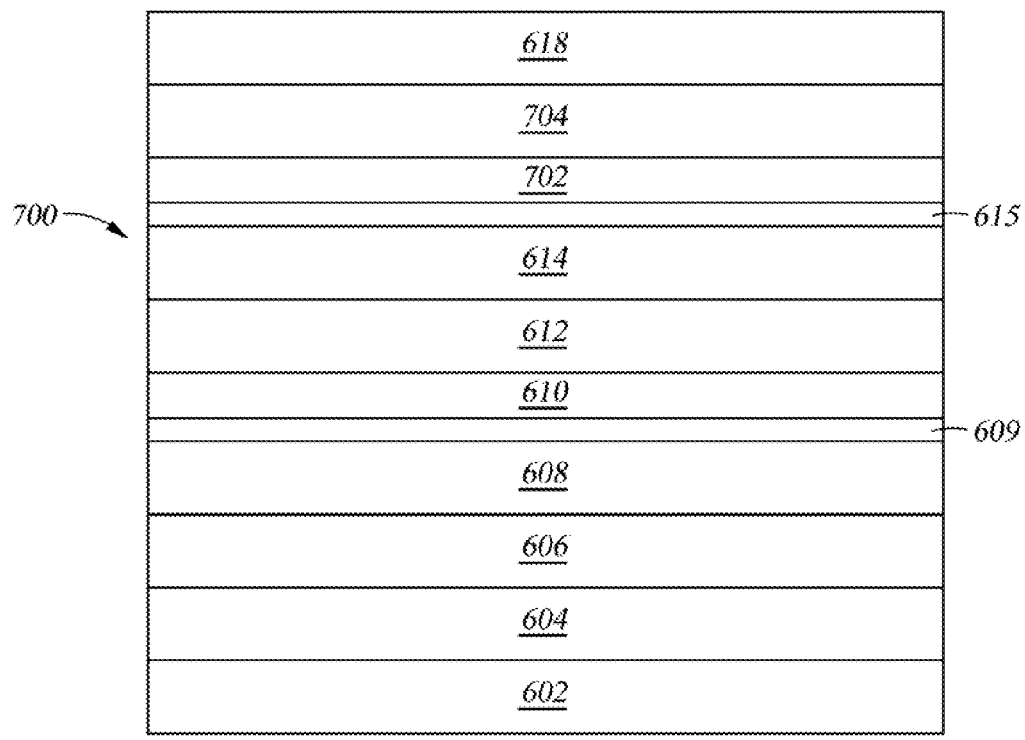
FIG. 7 is a schematic cross sectional view of a sensor stack according to one embodiment.

FIGS. 3 and 4 illustrate simple pinned sensor stacks each having at least one amorphous ferromagnetic layer. FIGS. 5, 6 and 7 illustrate antiparallel (AP) pinned sensor stacks each having at least one amorphous ferromagnetic layer. FIG. 5 is a schematic cross sectional view of a sensor stack 500 according to one embodiment. The sensor stack 500 may be the sensor stack 234 described in FIG. 2B. The sensor stack 500 may include one or more seed layers 502, and the one or more seed layers 502 may comprise the same materials as the one or more seed layers 302 described in FIG. 3. An antiferromagnetic layer 504 may be deposited on the one or more seed layers 502, and the antiferromagnetic layer 504 may comprise the same materials as the antiferromagnetic layer 304 described in FIG. 3.

A ferromagnetic pinned layer 506 may be deposited on the antiferromagnetic layer 504. The ferromagnetic pinned layer 506 may comprise one or more magnetic materials such as, for example NiFe, CoFe, CoFeB, or diluted magnetic alloys. A nonmagnetic coupling layer 508 may be deposited on the ferromagnetic pinned layer 506. The coupling layer 508 may comprise Ru, Cr, Ir, Rh or combinations thereof. A crystalline ferromagnetic underlayer 509 may be deposited on the coupling layer 508. The crystalline ferromagnetic underlayer 509 may comprise the same materials as the crystalline ferromagnetic underlayer 305 described in FIG. 3. A ferromagnetic reference layer 510 may be deposited on the crystalline ferromagnetic underlayer 509. The ferromagnetic reference layer 510 may comprise the same materials as the amorphous ferromagnetic reference layer 306 and may be deposited by one of the three methods described above. The amorphous ferromagnetic reference layer 510 again enhances magnetoresistance.

A nonmagnetic spacer layer 512 may be deposited on the amorphous ferromagnetic reference layer 510, and the nonmagnetic spacer layer 512 may be the nonmagnetic spacer layer 308 described in FIG. 3. A crystalline ferromagnetic underlayer 513 may be deposited on the nonmagnetic spacer layer 512, and the crystalline ferromagnetic underlayer 513 may comprise the same materials as the crystalline ferromagnetic underlayer 305 described in FIG. 3. A ferromagnetic free layer 514 may be deposited over the nonmagnetic spacer layer 512, such as on the crystalline ferromagnetic underlayer 513. The ferromagnetic free layer 514 may comprise the same materials as the ferromagnetic free layer 310 described in FIG. 3, and may be deposited by one of the three methods described above. In one embodiment, the ferromagnetic free layer 514 is crystalline, and is deposited directly on the nonmagnetic spacer layer 512. The crystalline ferromagnetic underlayer 513 may not be present in the stack if the ferromagnetic free layer 514 is crystalline. A capping layer 516 may be deposited on the ferromagnetic free layer 514, and the capping layer 516 may comprise the same materials as the capping layer 312 described in FIG. 3.

FIG. 6 is a schematic cross sectional view of a sensor stack 600 according to one embodiment. The sensor stack 600 may be the sensor stack 234 described in FIG. 2B. The sensor stack 600 may include one or more seed layers 602, and the one or more seed layers 602 may comprise the same material as the one or more seed layers 302 described in FIG. 3. An antiferromagnetic layer 604 may be deposited on the one or more seed layers 602, and the antiferromagnetic layer 604 may comprise the same material as the antiferromagnetic layer 304 described in FIG. 3. A ferromagnetic pinned layer 606 may be deposited on the antiferromagnetic layer 604, and the ferromagnetic pinned layer 606 may comprise the same material as the ferromagnetic pinned layer 506 described in FIG. 5. A nonmagnetic coupling layer 608 may be deposited on the ferromagnetic pinned layer 606, and the nonmagnetic coupling layer 608 may comprise the same material as the nonmagnetic coupling layer 508 described in FIG. 5. A crystalline ferromagnetic underlayer 609 may be deposited on the coupling layer 608. The crystalline ferromagnetic underlayer 609 may comprise the same materials as the crystalline ferromagnetic underlayer 305 described in FIG. 3.

An amorphous ferromagnetic underlayer 610 may be deposited on the crystalline ferromagnetic underlayer 609. The amorphous ferromagnetic underlayer 610 may comprise the same material as the amorphous ferromagnetic underlayer 406 described in FIG. 4. A ferromagnetic reference layer 612 may be deposited on the amorphous ferromagnetic underlayer 610, and the ferromagnetic reference layer 612 may be amorphous due to the amorphous structure of the underlayer 610. The ferromagnetic reference layer 612 may comprise the same material as the amorphous ferromagnetic reference layer 408 described in FIG. 4. A nonmagnetic spacer layer 614 may be deposited on the amorphous ferromagnetic reference layer 612, and the nonmagnetic spacer layer 614 may comprise the same material as the nonmagnetic spacer layer 308 described in FIG. 3. A crystalline ferromagnetic underlayer 615 may be deposited on the nonmagnetic spacer layer 614, and the crystalline ferromagnetic underlayer 615 may comprise the same materials as the crystalline ferromagnetic underlayer 305 described in FIG. 3. A ferromagnetic free layer 616 may be deposited over the nonmagnetic spacer layer 614, such as on the crystalline ferromagnetic underlayer 615. The ferromagnetic free layer 616 may be amorphous and comprise the same materials as the ferromagnetic free layer 310 described in FIG. 3, and may be deposited by one of the three methods described above. In one embodiment, the ferromagnetic free layer 616 is crystalline, and is deposited directly on the nonmagnetic spacer layer 614. The crystalline ferromagnetic underlayer 615 may not be present in the stack if the ferromagnetic free layer 616 is crystalline. A capping layer 618 may be deposited on the ferromagnetic free layer 616, and the capping layer 618 may comprise the same material as the capping layer 312 described in FIG. 3.

FIG. 7 is a schematic cross sectional view of a sensor stack 700 according to one embodiment. The sensor stack 700 may be the sensor stack 234 described in FIG. 2B. The sensor stack 700 may be similar to the sensor stack 600, except that the ferromagnetic free layer 616 shown in FIG. 6 is an amorphous ferromagnetic free layer 704 and an amorphous ferromagnetic underlayer 702 is disposed between the crystalline ferromagnetic underlayer 615 and the amorphous ferromagnetic free layer 704. The amorphous ferromagnetic underlayer 702 may comprise the same materials as the amorphous ferromagnetic underlayer 610 described in FIG. 6. The amorphous structure of the underlayer 702 causes the ferromagnetic free layer 704 to be amorphous. Having amorphous reference and free layers 612, 704 enhance magnetoresistance, leading to an improved sensor.

In summary, a magnetic head having enhanced magnetoresistance is disclosed. The enhanced magnetoresistance is the result of having an amorphous ferromagnetic reference layer. The ferromagnetic reference layer may be amorphous by certain deposition methods, or by having an amorphous ferromagnetic underlayer. The ferromagnetic reference layer is deposited on the amorphous ferromagnetic underlayer, and the amorphous structure of the underlayer causes the ferromagnetic reference layer to be amorphous.

While the foregoing is directed to embodiments, other and further embodiments of the disclosure may be devised without departing from the basic scope thereof, and the scope thereof is determined by the claims that follow.

What is claimed is:
1. A magnetic head, comprising:
a sensor stack, wherein the sensor stack includes:
an antiferromagnetic layer;
a first crystalline ferromagnetic underlayer;
an amorphous ferromagnetic layer disposed on the crystalline ferromagnetic underlayer;
a nonmagnetic layer disposed over the amorphous ferromagnetic layer;
a second crystalline ferromagnetic underlayer disposed over the nonmagnetic layer; and
a ferromagnetic free layer disposed on the second crystalline ferromagnetic underlayer.
2. The magnetic head of claim 1, wherein the ferromagnetic free layer is amorphous.
3. The magnetic head of claim 1, further comprising an amorphous ferromagnetic reference layer, wherein the amorphous ferromagnetic reference layer is deposited on the first crystalline ferromagnetic underlayer at a temperature between about 50 K to about 100 K.
4. A magnetic head, comprising:
a sensor stack, wherein the sensor stack includes:
an antiferromagnetic layer;
a first crystalline ferromagnetic underlayer;
an amorphous ferromagnetic reference layer disposed over the crystalline ferromagnetic underlayer;
a nonmagnetic layer disposed on the amorphous ferromagnetic reference layer;
a second crystalline ferromagnetic underlayer disposed over the nonmagnetic layer;
a ferromagnetic free layer disposed on the second crystalline ferromagnetic underlayer;
a first amorphous ferromagnetic underlayer disposed between the first crystalline ferromagnetic underlayer and the amorphous ferromagnetic reference layer; and
a second amorphous ferromagnetic underlayer disposed between the nonmagnetic layer and the second crystalline ferromagnetic underlayer.
5. The magnetic head of claim 4, wherein the second amorphous ferromagnetic underlayer comprises CoFeBTa, CoTiB or CoFeGe.
6. A hard disk drive, comprising:
a magnetic media;
a magnetic write head; and
a magnetic read head, wherein the magnetic read head includes:
a sensor stack, wherein the sensor stack includes:
an antiferromagnetic layer;
a first crystalline ferromagnetic underlayer disposed over the antiferromagnetic layer;
a first amorphous ferromagnetic underlayer disposed over the first crystalline ferromagnetic underlayer;
an amorphous ferromagnetic reference layer disposed over the first amorphous ferromagnetic underlayer;
a first nonmagnetic layer disposed over the amorphous ferromagnetic reference layer;
a second crystalline ferromagnetic underlayer disposed over the first nonmagnetic layer;

a second amorphous ferromagnetic underlayer disposed over the second crystalline ferromagnetic; and an amorphous ferromagnetic free layer disposed over the second amorphous ferromagnetic underlayer.

7. The hard disk drive of claim 6, wherein the first amorphous ferromagnetic underlayer comprises CoFeBTa, CoTiB or CoFeGe.

8. The hard disk drive of claim 7, wherein the second amorphous ferromagnetic underlayer comprises CoFeBTa, CoTiB or CoFeGe.

9. The hard disk drive of claim 6, further comprising a ferromagnetic pinned layer disposed on the antiferromagnetic layer, wherein the first amorphous ferromagnetic underlayer is disposed over the ferromagnetic pinned layer.

10. The hard disk drive of claim 9, further comprising a second nonmagnetic layer disposed on the ferromagnetic pinned layer, wherein the first amorphous ferromagnetic underlayer is disposed over the second nonmagnetic layer.

11. The hard disk drive of claim 10, wherein the amorphous ferromagnetic reference layer is disposed on the first amorphous ferromagnetic underlayer, the first nonmagnetic layer is disposed on the amorphous ferromagnetic reference layer, the second amorphous ferromagnetic underlayer is disposed over the first nonmagnetic layer, and the amorphous ferromagnetic free layer is disposed on the second amorphous ferromagnetic underlayer.

\* \* \* \* \*